(12) United States Patent
Huemoeller

(10) Patent No.: US 6,407,458 B1
(45) Date of Patent: Jun. 18, 2002

(54) MOISTURE-RESISTANT INTEGRATED CIRCUIT CHIP PACKAGE AND METHOD

(75) Inventor: Ronald P. Huemoeller, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/565,586

(22) Filed: May 4, 2000

(51) Int. Cl.⁷ ............................................... H01L 23/48
(52) U.S. Cl. ....................................... 257/778; 257/774
(58) Field of Search ................................. 361/760, 704; 257/698, 738, 697, 774, 778, 779, 787, 781

(56) References Cited

U.S. PATENT DOCUMENTS

| | | | | |
|---|---|---|---|---|
| 5,355,283 A | * | 10/1994 | Marrs et al. ................ | 361/760 |
| 5,386,342 A | | 1/1995 | Rostoker ..................... | 361/749 |
| 5,397,917 A | * | 3/1995 | Ommen et al. .............. | 257/698 |
| 5,450,283 A | * | 9/1995 | Lin et al. ..................... | 361/704 |
| 5,640,047 A | * | 6/1997 | Nakashima .................. | 257/738 |
| 5,650,593 A | | 7/1997 | McMillan et al. ........... | 174/52.4 |
| 5,929,522 A | | 7/1999 | Weber ......................... | 257/738 |
| 5,962,917 A | * | 10/1999 | Moriyama .................... | 257/697 |
| 6,034,427 A | * | 3/2000 | Lan et al. .................... | 257/698 |
| 6,249,053 B1 | * | 6/2001 | Nakata et al. ............... | 257/738 |

* cited by examiner

*Primary Examiner*—David Nelms
*Assistant Examiner*—B. Le
(74) *Attorney, Agent, or Firm*—Skjerven Morrill MacPherson LLP; James E. Parsons

(57) ABSTRACT

A novel, moisture-resistant integrated circuit chip package is disclosed. In one embodiment, the integrated circuit chip package includes a substrate having a chip side and a backside. A first conductive layer is formed on the chip side of the substrate, and has a pattern forming conductive traces. A first soldermask layer is formed on the chip side of the substrate. The first soldermask layer directly contacts the first conductive layer. The first soldermask layer has at least one opening formed therein. A first contact layer is formed over the first conductive layer in the opening of the first soldermask layer. A second conductive layer is formed on the backside of the substrate. A second soldermask layer is formed on the back side of the substrate and has at least one opening formed therein. A second contact layer overlies the second conductive layer in the opening of the second soldermask layer. The soldermask layer on the chip side of the substrate has high adhesion to the conductive layer, resulting in a high level of moisture resistance for the package.

27 Claims, 3 Drawing Sheets

US 6,407,458 B1

MOISTURE-RESISTANT INTEGRATED CIRCUIT CHIP PACKAGE AND METHOD

TECHNICAL FIELD OF THE INVENTION

The present invention relates to integrated circuit chip packages, and in particular to a moisture-resistant integrated circuit chip package and method.

BACKGROUND OF THE INVENTION

In some ball grid array (BGA) packages, a substrate is provided with vias. A conductor such as copper is patterned on both sides of the substrate and fills the vias. The copper in the vias provides an electrical connection between conductive areas the top side ("chip side") of the substrate and conductive areas on the bottom side ("ball side") of the substrate. A plating material such as nickel-gold is typically used as the etch mask when the copper is patterned. This means that nickel-gold plate is present not only in the bond pad and solder pad areas of the copper, but also wherever a trace is present on either side of the substrate. A soldermask formed to cover both sides of the substrate while leaving bond pad and solder pad areas uncovered. This means that the soldermask material covers the nickel-gold plating over the conductive traces. Conventional soldermask material does not adhere well to nickel-gold. This lack of adhesion results in poor moisture resistance. For example, JEDEC Level 2 Moisture Resistance Testing exposes a package to 60% relative humidity at 85° C. for 192 hours. BGA packages manufactured using the above-described conventional process cannot meet this level of moisture resistance testing.

SUMMARY OF THE INVENTION

Therefore, a need has arisen for an integrated circuit chip package that addresses the disadvantages and deficiencies of the prior art. In particular, a need has arisen for an integrated circuit chip package with high moisture resistance.

Accordingly, an integrated circuit chip package is disclosed. In one embodiment, the integrated circuit chip package includes a substrate having a chip side and a backside. A first conductive layer is formed on the chip side of the substrate, and has a pattern forming conductive traces. A first soldermask layer is formed on the chip side of the substrate. The first soldermask layer directly contacts the first conductive layer. The first soldermask layer has at least one opening formed therein. A first contact layer is formed over the first conductive layer in the opening of the first soldermask layer. A second conductive layer is formed on the backside of the substrate. A second soldermask layer is formed on the back side of the substrate and has at least one opening formed therein. A second contact layer overlies the second conductive layer in the opening of the second soldermask layer.

In another aspect of the present invention, a method for fabricating an integrated circuit chip package is disclosed. In one embodiment, the method includes forming a first conductive layer on a first side of a substrate, forming a second conductive layer on a second side of the substrate, forming an electrical connection between the first and second conductive layers, selectively etching the first conductive layer to form a first pattern on the first side of the substrate, forming a soldermask layer over selected portions of the first side of the substrate, electroplating a first contact layer on at least one portion of the first conductive layer exposed by the soldermask layer to form at least one contact area, and electroplating a second contact layer on the second conductive layer.

An advantage of the present invention is that the soldermask layer on the chip side of the substrate has high adhesion to the conductive layer. This results in a higher level of moisture resistance for the package.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 11 of the drawings. Like numerals are used for like and corresponding parts of the various drawings.

FIGS. 1 through 11 show cross sections of an integrated circuit package 10 at various stages of fabrication. As described below, the resulting integrated circuit package 10 has a high level of moisture resistance.

Figure 1:
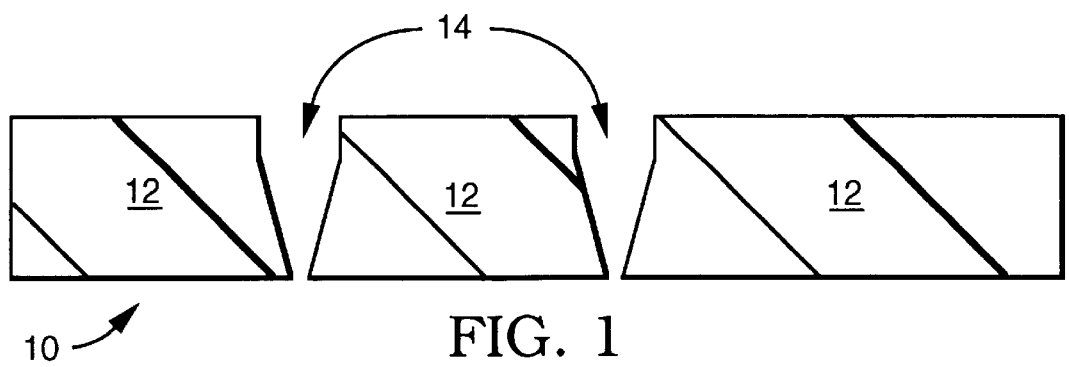
FIGS. 1 through 11 are cross sections of an integrated circuit package at various stages of fabrication.

Referring to FIG. 1, a substrate 12 has vias 14 formed therein. Substrate 12 may be a flexible, tape substrate made from, for example, Kapton or polyimide with a thickness of 50 microns. Vias 14 may be formed by laser ablation of substrate 12, which yields a tapered or conical shape to vias 14. Vias 14 may, for example, have a maximum diameter of approximately 125 microns and a minimum diameter of approximately 25 microns.

Figure 2:
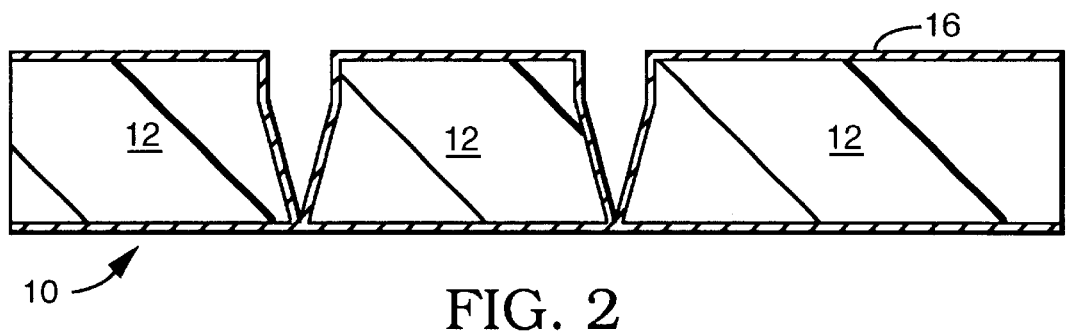

Referring to FIG. 2, a layer of copper 16 is formed on the surface of substrate 12, covering the top and bottom sides of substrate 12 and the inside surfaces of vias 14. Layer 16 may be a seed layer of copper with a thickness of approximately 98 Å form on substrate 12 by known sputtering techniques.

Figure 3:
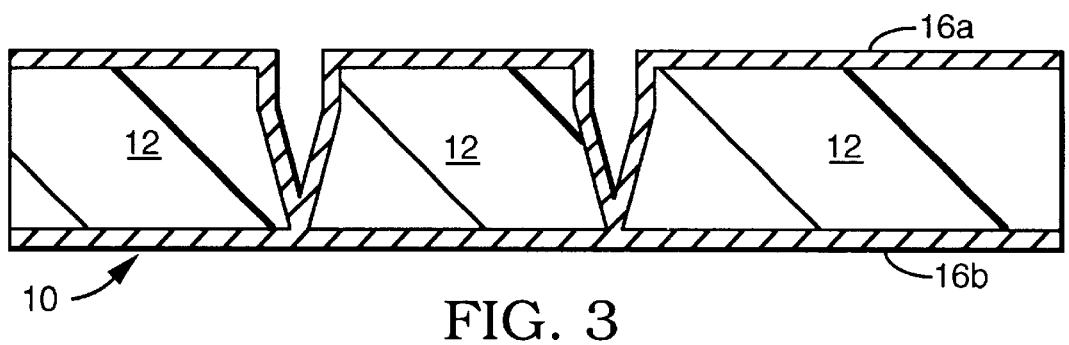

Referring to FIG. 3, layer 16 is increased in thickness to approximately 130 microinches (3.3 microns) by electroplating. This thickness is sufficient for layer 16 to completely fill in vias 14 at their narrowest points. In the description that follows, layer 16 will be considered to comprise a layer 16a residing on the chip side of substrate 12 and a layer 16b residing on the backside of substrate 12.

Figure 4:
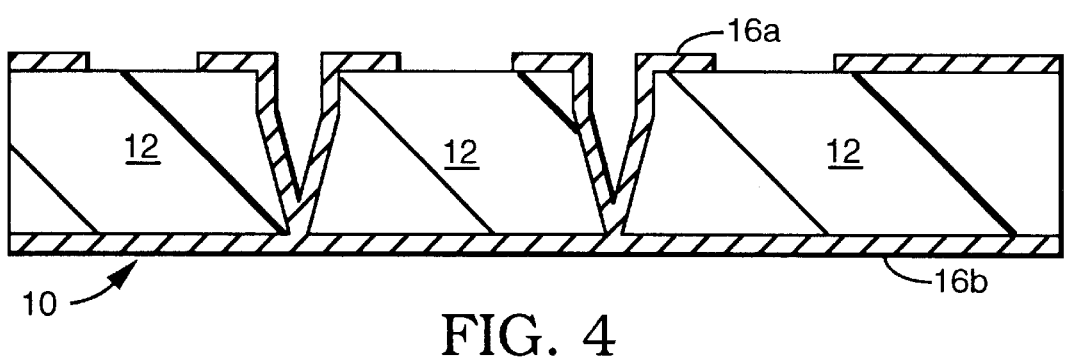

Referring to FIG. 4, layer 16a is patterned on the top side (chip side) of substrate 12. This patterning may be performed using a conventional dry film photoresist (not shown) with a thickness of approximately 30 microns. After the photoresist is developed, layer 16a may be etched with, for example, cupric chloride, after which the photoresist may be removed.

Figure 5:
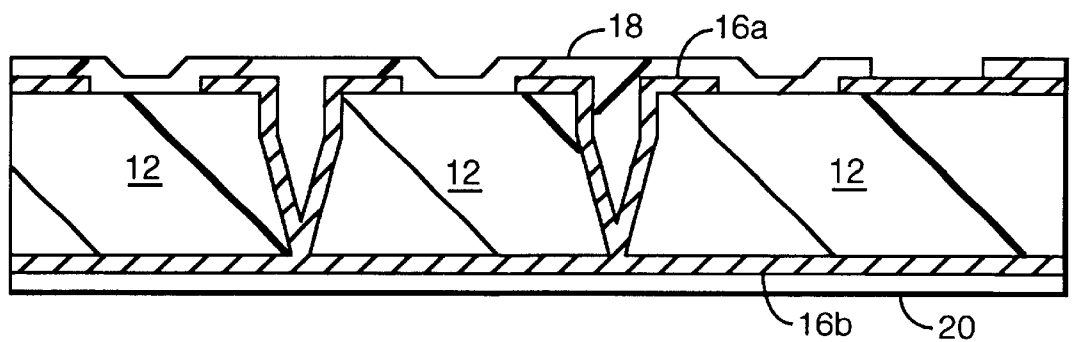

Referring to FIG. 5, a soldermask layer 18 is deposited on the chip side of substrate 12. Soldernask layer 18 may be formed using a liquid soldermask such as AUS9 or AUS11 soldermask available from Taiyo Ink Mfg. Co., Ltd., in Tokyo, Japan. Soldermask layer 18 is then patterned using conventional techniques to expose wirebond pad areas of layer 16a to be plated with a contact metal. On the bottom side (backside) of substrate 12, a photoresist layer 20 is formed over copper layer 16b to protect layer 16b from contact metal electroplating.

Figure 6:
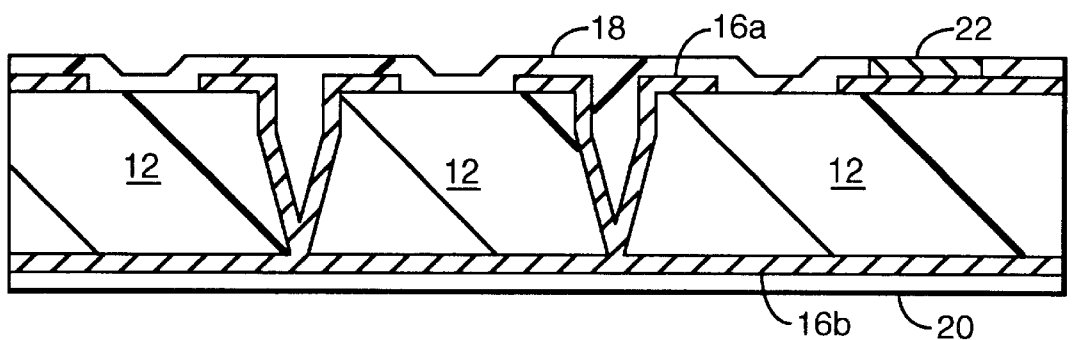

Referring to FIG. 6, a contact layer 22 is plated on the exposed areas of copper layer 16a. Layer 22 may be formed by electroplating between five and 12 microns of nickel, followed by plating between one-half and one micron of gold. Copper layer 16b on the backside of substrate 12 may provide electrical contact to copper layer 16a on the chip side of substrate 12 through vias 14 during this electroplating process, thereby eliminating the need for bussing tails which consume valuable package "real estate."

Figure 7:
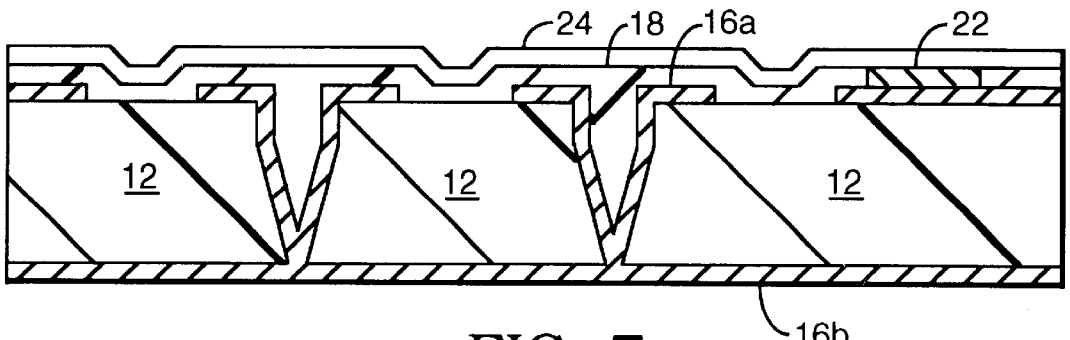

Referring to FIG. 7, photoresist layer 20 is removed from the backside of substrate 12 and a photoresist layer 24 is formed on the chip side of substrate 12. Photoresist layer 24 may be formed in the same manner as photoresist layer 20. Photoresist layer 24 serves to protect copper layer 16a on the chip side of the substrate 12 from contact metal plating.

Figure 8:
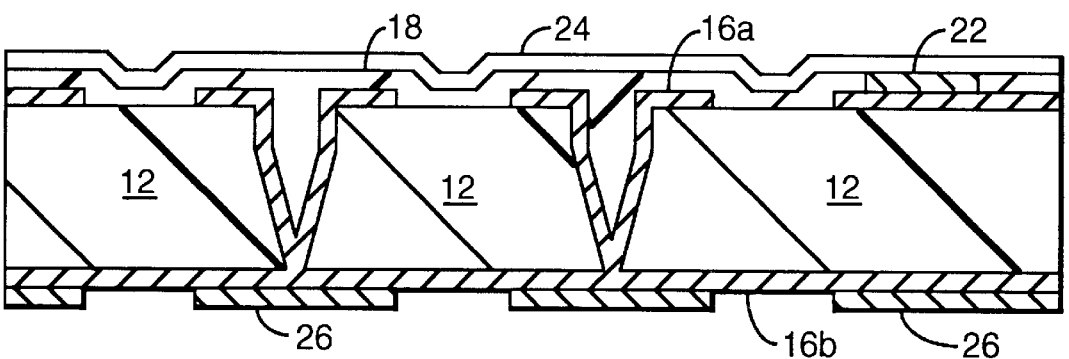

Referring to FIG. 8, a contact layer 26 is formed and patterned on the backside of substrate 12. Contact layer 26 may be formed by electroplating of nickel and gold as previously described in connection with layer 22. Contact layer 26 may be patterned using a conventional dry film photoresist (not shown) with a thickness of approximately 30 microns as an etch resist, and using an alkaline etchant such as ammoniacal etchant. As will be described below, contact layer 26 serves not only as a contact layer, but also as an etch resist for copper layer 16b on the backside of substrate 12.

Figure 9:
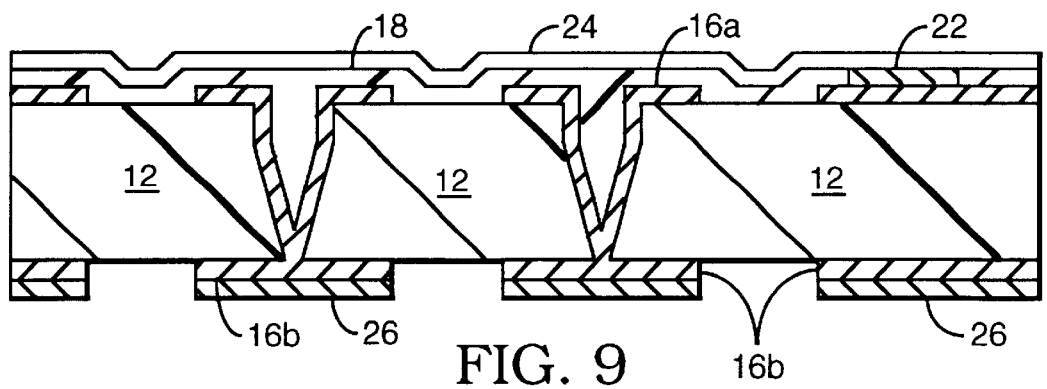

Referring to FIG. 9, copper layer 16b is removed in the areas exposed by contact layer 26. Copper layer 16b may be etched away in these exposed areas using, for example, cupric chloride.

Figure 10:
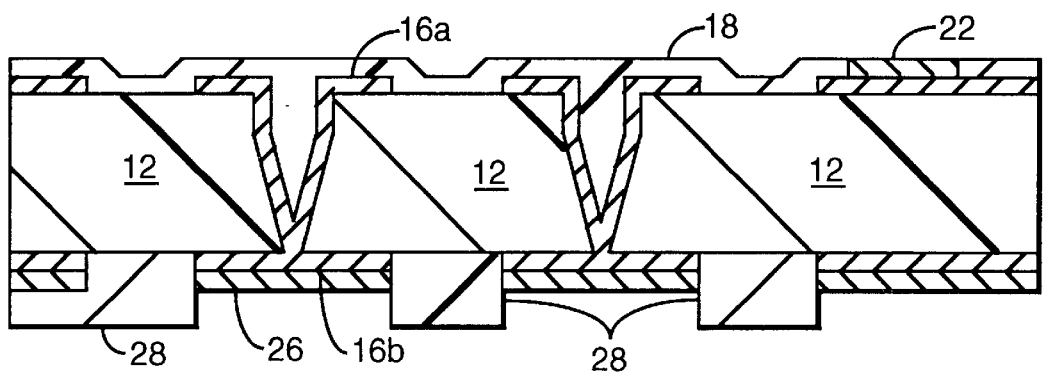

Referring to FIG. 10, photoresist layer 24 is removed from the chip side of substrate 12 and a layer of soldermask 28 is formed and patterned on the backside of substrate 12. Soldermask layer 28 may be formed using, for example, a liquid soldermask such as the aforementioned AUS9 or AUS11 soldermask. Soldermask layer 28 is then patterned using conventional techniques to expose solder pad areas of contact layer 26.

Figure 11:
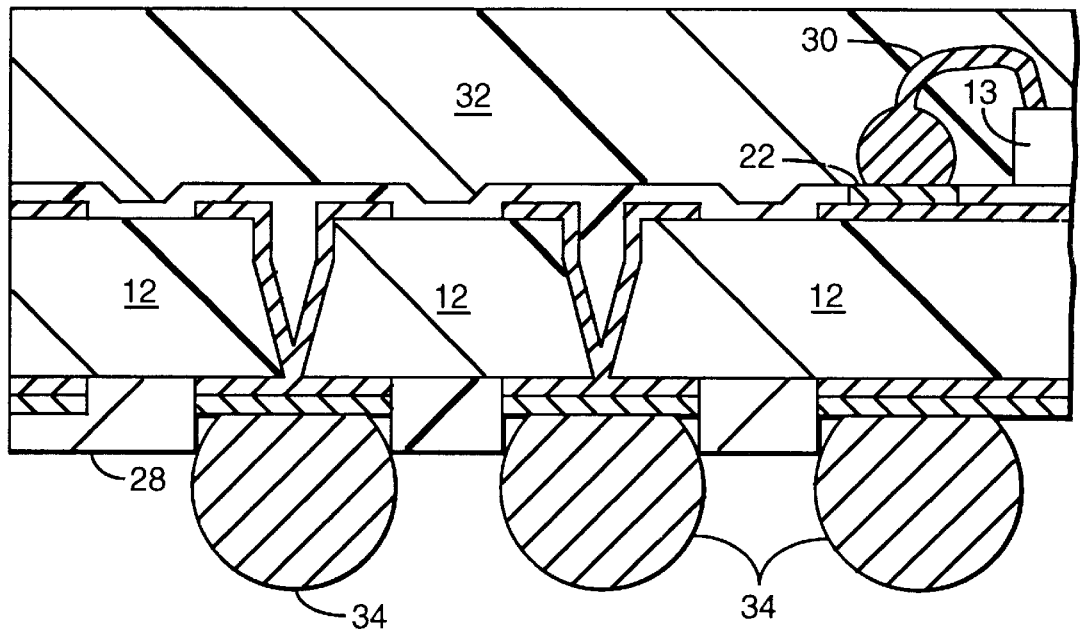

Substrate 12 is now ready to receive a semiconductor die and solder balls for attachment to a printed circuit board. Referring to FIG. 11, a semiconductor die 13 is attached to substrate 12. Bond wires 30 are formed between the die 13 and the wirebond pads of layer 22. A mold compound 32 may then be injection-molded around the die and bond wires 22. Solder balls 34, which may be eutectic solder balls of conventional composition and design, are attached to the solder pad areas of contact layer 26 using conventional techniques. Package 10 may then be attached to a printed circuit board by reflowing solder balls 34 using conventional techniques.

It will be appreciated from the foregoing description that the patterning of copper layer 16a is different from that of copper layer 16b. In particular, the patterning of copper layer 16a does not follow the conventional technique in which a Ni/Au contact layer (such as layer 22 or layer 26) is used as an etch mask for the copper layer. Instead, a photoresist is used to pattern copper layer 16a. Soldermask layer 18 then acts as a mask for the wirebond pad plating of copper layer 16a. As a result, soldermask layer 18 (unlike soldermask layer 28) is in physical contact with only substrate 12 and copper layer 16a. Soldermask layer 18 does not overlie any portion of contact layer 22, and thus any concern about the adhesion (or lack of adhesion) of soldermask layer 18 to Ni/Au is obviated by this design. Since soldermask layer 18 plays a crucial role in determining the moisture resistance of package 10, the high level of adhesion of soldermask layer 18 to copper layer 16a and substrate 12 results in high moisture resistance.

Although the present invention and its advantages have been described in detail, it should be understood that various changes, substitutions, and alterations can be made therein without departing from the spirit and scope of the invention as defined by the appended claims.

I claim:
1. An integrated circuit chip package comprising:
   a substrate;
   a first conductive layer formed on the substrate, the first conductive layer having a pattern forming conductive traces;
   a first soldermask layer formed on the substrate, the first soldermask layer directly contacting the first conductive layer, the first soldermask layer having at least one opening formed therein;
   a first contact layer formed over the first conductive layer in the opening of the first soldermask layer;
   an encapsulant encapsulating at least a portion of the first contact layer.
2. The integrated circuit chip package of claim 1, further comprising a semiconductor die attached to the chip side of the substrate.
3. The integrated circuit chip package of claim 2, further comprising a bond wire attached between the contact area of the first contact layer and the semiconductor die.
4. The integrated circuit chip package of claim 3 the encapsulant encapsulating the semiconductor die and the bond wire.
5. The integrated circuit chip package of claim 1, further comprising a second soldermask layer formed over selected portions of the backside of the substrate.
6. The integrated circuit chip package of claim 5, further comprising a solder mass attached to a portion of the second contact layer exposed by the second soldermask layer.
7. The integrated circuit chip package of claim 1, further comprising a plurality of vias formed in the substrate, the vias providing electrical connections between respective regions of the first and second conductive layers.
8. The integrated circuit chip package of claim 1, wherein the first and second conductive layers comprise copper.
9. The integrated circuit chip package of claim 1, wherein the first and second contact layers comprise Ni/Au.
10. An integrated circuit chip package comprising:
    a substrate;
    a first conductive layer formed on the substrate, the first conductive layer having a pattern forming conductive traces;
    a first soldermask layer formed on the substrate, the first soldermask layer directly contacting the first conductive layer, the first soldermask layer having a plurality of openings formed therein;
    a first contact layer formed over the first conductive layer in each of the openings of the first soldermask layer.
11. The integrated circuit chip package of claim 10, further comprising:
    a second conductive layer formed on the backside of the substrate;
    a second soldermask layer formed on the second conductive layer, the second soldermask layer having at least one opening formed therein; and
    a second contact layer overlying the second conductive layer in the opening of the second soldermask layer.
12. The integrated circuit chip package of claim 10, wherein the first soldermask layer does not overlie any portion of the first contact layer.
13. The integrated circuit chip package of claim 10 further comprising a semiconductor die attached to the substrate.
14. The integrated circuit chip package of claim 13, further comprising a bond wire attached between the first contact layer and the semiconductor die.

15. The integrated circuit. chip package of claim 10, wherein the first soldermask layer is directly adhered to the first conductive layer and to the chip side of the substrate.

16. The integrated circuit chip package of claim 10, wherein the first contact layer comprises Ni/Au.

17. The integrated circuit chip package of claim 10, further comprising:
- a second soldermask layer formed on the back side of the substrate, the second soldermask layer having at least one opening formed therein; and
- a second contact layer overlying the second conductive layer in the opening of the second soldermask layer;
- a solder mass attached to a portion of the second contact layer exposed by the second soldermask layer.

18. An integrated circuit chip package comprising:
- a substrate;
- a first conductive layer formed on the substrate, the first conductive layer having a pattern forming conductive traces;
- a first soldermask layer formed on the chip side of the substrate, the first soldermask layer directly contacting the first conductive layer, the first soldermask layer having at least one opening formed therein; and
- a first contact layer formed over the first conductive layer in the opening of the first soldermask layer, the first contact layer filling the opening of the first soldermask layer.

19. The integrated circuit chip package of claim 18, further comprising:
- a second conductive layer formed on the backside of the substrate;
- a second soldermask layer formed on the back side of the substrate, the second soldermask layer having at least one opening formed therein; and
- a second contact layer overlying the second conductive layer in the opening of the second soldermask layer.

20. The integrated circuit chip package of claim 18, wherein the first soldermask layer does not overlie any portion of the first contact layer.

21. The integrated circuit chip package of claim 18, further comprising a semiconductor die attached to the chip side of the substrate.

22. The integrated circuit chip package of claim 21, further comprising a bond wire attached between the first contact layer and the semiconductor die.

23. The integrated circuit chip package of claim 18, further comprising a mold compound encapsulating the semiconductor die and the bond wire.

24. The integrated circuit chip package of claim 18, wherein the first soldermask layer is directly adhered to the first conductive layer and to the chip side of the substrate.

25. The integrated circuit chip package of claim 18, wherein the first contact layer comprises Ni/Au.

26. An integrated circuit chip package comprising:
- a substrate;
- a first conductive layer formed on the substrate, the first conductive layer having a pattern forming conductive traces;
- a first soldermask layer formed on the substrate, the first soldermask layer directly contacting the first conductive layer, the first soldermask layer having a plurality of openings formed therein;
- a first contact layer formed over the first conductive layer in each of the openings of the first soldermask layer, wherein the first contact layer fills each of the openings;
- an encapsulant encapsulating at least one of the first conductive layers.

27. The integrated circuit chip package of claim 26, further comprising a semiconductor die mounted on the substrate, the semiconductor die being electrically coupled to the first contact layer.

\* \* \* \* \*

UNITED STATES PATENT AND TRADEMARK OFFICE
CERTIFICATE OF CORRECTION

PATENT NO.    : 6,407,458 B1
DATED         : June 18, 2002
INVENTOR(S)   : Ronald P. Huemoeller It is certified that error appears in the above-identified patent and that said Letters Patent is hereby corrected as shown below:

<u>Title page,</u>
Item [56], References Cited, please insert -- OTHER PUBLICATIONS, U.S. Patent Application 09/561,180, Huemoeller, Ronald P., "Moisture-Resistant Integrated Circuit Chip Package and Method," filed 04/27/00, 13 pp. plus 4 pp. of figures. --

Signed and Sealed this

Tenth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO. : 6,407,458 B1
DATED : June 18, 2002
INVENTOR(S) : Ronald P. Huemoeller It is certified that error appears in the above-identified patent and that said Letters Patent is hereby corrected as shown below:

<u>Title page,</u>
Item [54], delete "AND METHOD"; and

<u>Column 2,</u>
Line 54, delete "Soldernask" and insert -- Soldermask --.

Signed and Sealed this

First Day of April, 2003

JAMES E. ROGAN
*Director of the United States Patent and Trademark Office*